(12) United States Patent
Hsien et al.

(10) Patent No.: US 7,589,650 B2
(45) Date of Patent: Sep. 15, 2009

(54) ANALOG-TO-DIGITAL CONVERTER WITH CALIBRATION

(75) Inventors: Szu-Kang Hsien, Taoyuan County (TW); Tsung-Shuen Hung, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/938,795

(22) Filed: Nov. 13, 2007

(65) Prior Publication Data

US 2008/0158037 A1  Jul. 3, 2008

Related U.S. Application Data

(60) Provisional application No. 60/882,606, filed on Dec. 29, 2006.

(51) Int. Cl.
*H03M 1/06* (2006.01)
(52) U.S. Cl. ........................ 341/118; 341/144
(58) Field of Classification Search ................. 341/118, 341/120, 155, 144, 143
See application file for complete search history.

(56) References Cited

U.S. PATENT DOCUMENTS

| | | | |
|---|---|---|---|
| 5,696,508 A | 12/1997 | Gross, Jr. et al. | |
| 5,789,974 A | 8/1998 | Ferguson, Jr. et al. | |
| 6,160,851 A * | 12/2000 | Brown et al. | 375/254 |
| 6,313,776 B1 * | 11/2001 | Brown | 341/144 |
| 6,507,241 B1 * | 1/2003 | Ritter | 330/9 |
| 6,515,464 B1 | 2/2003 | Darmawaskita et al. | |
| 6,612,502 B2 * | 9/2003 | Poucher | 236/78 D |
| 6,847,320 B1 | 1/2005 | Taft et al. | |
| 7,075,465 B2 | 7/2006 | Jonsson et al. | |
| 2007/0152863 A1 * | 7/2007 | Le et al. | 341/155 |

* cited by examiner

*Primary Examiner*—Peguy JeanPierre
(74) *Attorney, Agent, or Firm*—Jianq Chyun IP Office (57) ABSTRACT

An analog-to-digital converter with calibration is provided. The converter includes at least one conversion unit. The conversion unit includes a comparator, a control unit, a count unit, and a calibration unit. The comparator compares the voltage of the first input terminal with the voltage of the second input terminal and outputs a comparison result. The control unit outputs a control signal according to a comparison result of the comparator and a selecting signal. The count unit performs a count operation according to the control signal and outputs a count result. The calibration unit provides a reference voltage to the second input terminal of the comparator, and adjusts the level of the reference voltage according to the count result of the count unit. Thus, reference voltage is included inside each conversion unit and conventional resistor ladder producing reference voltage can be removed.

9 Claims, 11 Drawing Sheets

ANALOG-TO-DIGITAL CONVERTER WITH CALIBRATION

CROSS-REFERENCE TO RELATED APPLICATION

This application claims the priority benefit of U.S.A. provisional application Ser. No. 60/882,606, filed on Dec. 29, 2006, all disclosures are incorporated herein by reference.

BACKGROUND OF THE INVENTION

1. Field of the Invention

The present invention relates to an analog-to-digital converter (ADC). More particularly, the present invention relates to an ADC with calibration.

2. Description of Related Art

With the continuous increase of a communication network bandwidth, a conversion speed of a front-end analog-to-digital circuit (ADC) must also be increasingly improved to meet the requirements of an overall system. For example, ultra-wideband (UWB) wireless communication and partial response-maximum likelihood (PRML) need a high-speed sampling clock ADC with 4-6 bits of resolution and low power consumption. Therefore, it is an inevitable trend to develop a high-speed ADC with calibration capability to decrease power consumption.

In a high-speed flash ADC, it is mainly the process variation of a reference ladder resistance and an offset voltage (Vos) caused by an unmatched transistor on a path of a comparator (including a preamplifier and a latch) that influences the accuracy. In order to prevent the comparator from being affected by an input offset voltage, a transistor with a larger aspect ratio is usually required. However, as a result, the parasitic capacitance effect is aggravated, resulting in the limitation to the ADC when operating at a high frequency and thus higher power consumption. In view of this, flash type ADC with a calibration mechanism for saving power consumption will become mainstream in the future.

Figure 1:
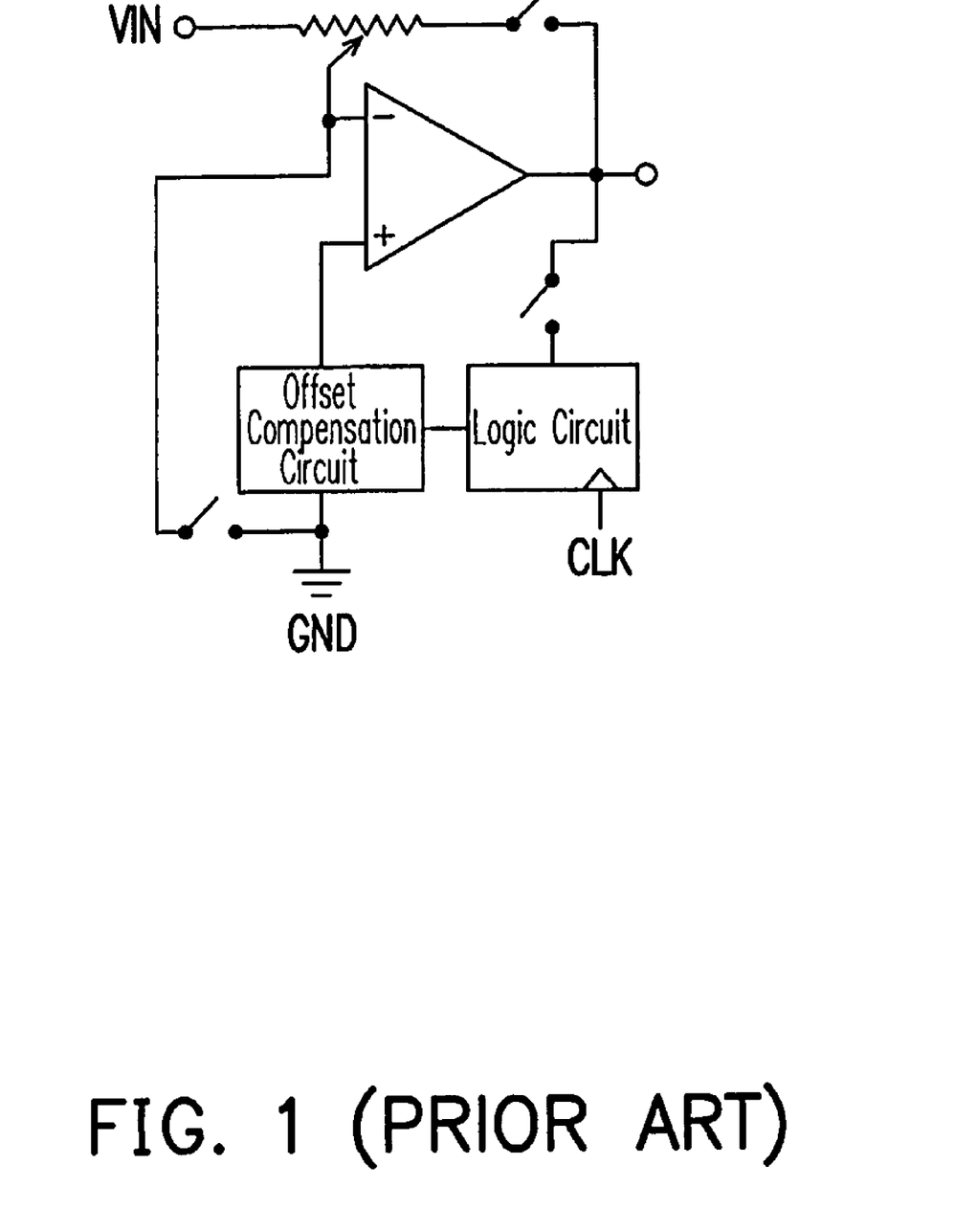
FIG. 1 is a circuit diagram of a conventional method of calibrating DC-offset of amplifiers.

FIG. 1 is a circuit diagram of calibrating the DC-offset of amplifiers disclosed in US Patent Publication No. U.S. Pat. No. 5,789,974. Referring to FIG. 1, during a calibration process, a negative input terminal of an amplifier is grounded, so an equivalent offset voltage at two input ends of the amplifier is amplified to a logic level via an open loop configuration. Then, the logic value is determined to drive an offset compensation circuit to compensate an offset voltage. The offset voltage of the amplifier can be compensated to the minimum with this technique.

Figure 2:
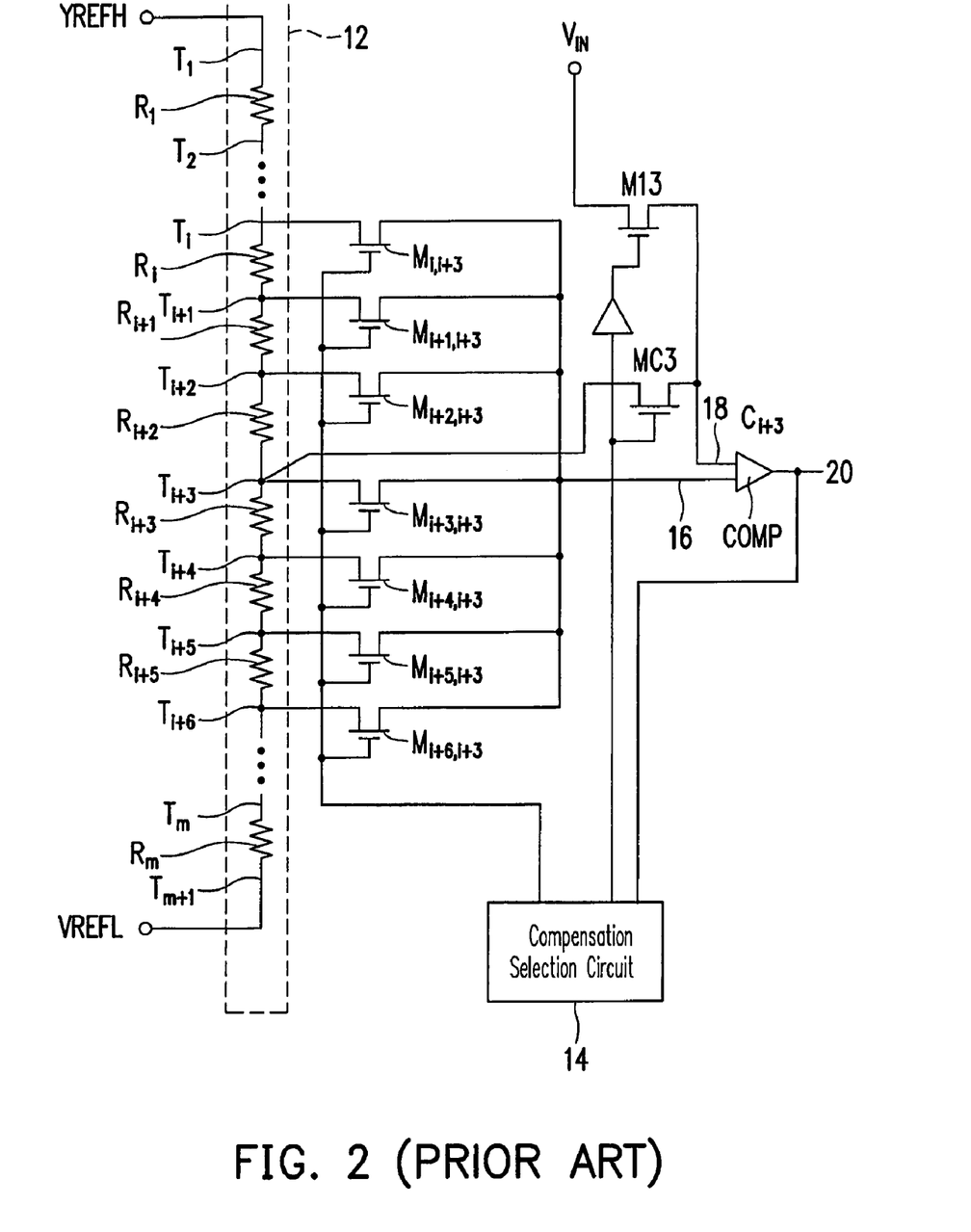
FIG. 2 is a circuit diagram of a conventional comparator-offset compensating converter.

FIG. 2 is a circuit diagram of a comparator-offset compensating converter disclosed in US Patent Publication No. U.S. Pat. No. 5,696,508. Referring to FIG. 2, provided that an offset voltage variation is greater than one least significant bit (1 LSB), during the calibration, after ±3LSB on the reference ladder 12 is switched, the minimum offset on a tap is obtained after comparing with an adjacent tap. This technique is only used to calibrate the offset voltage of ±1LSB, so it is not applicable to high precision ADC compensation.

Figure 3:
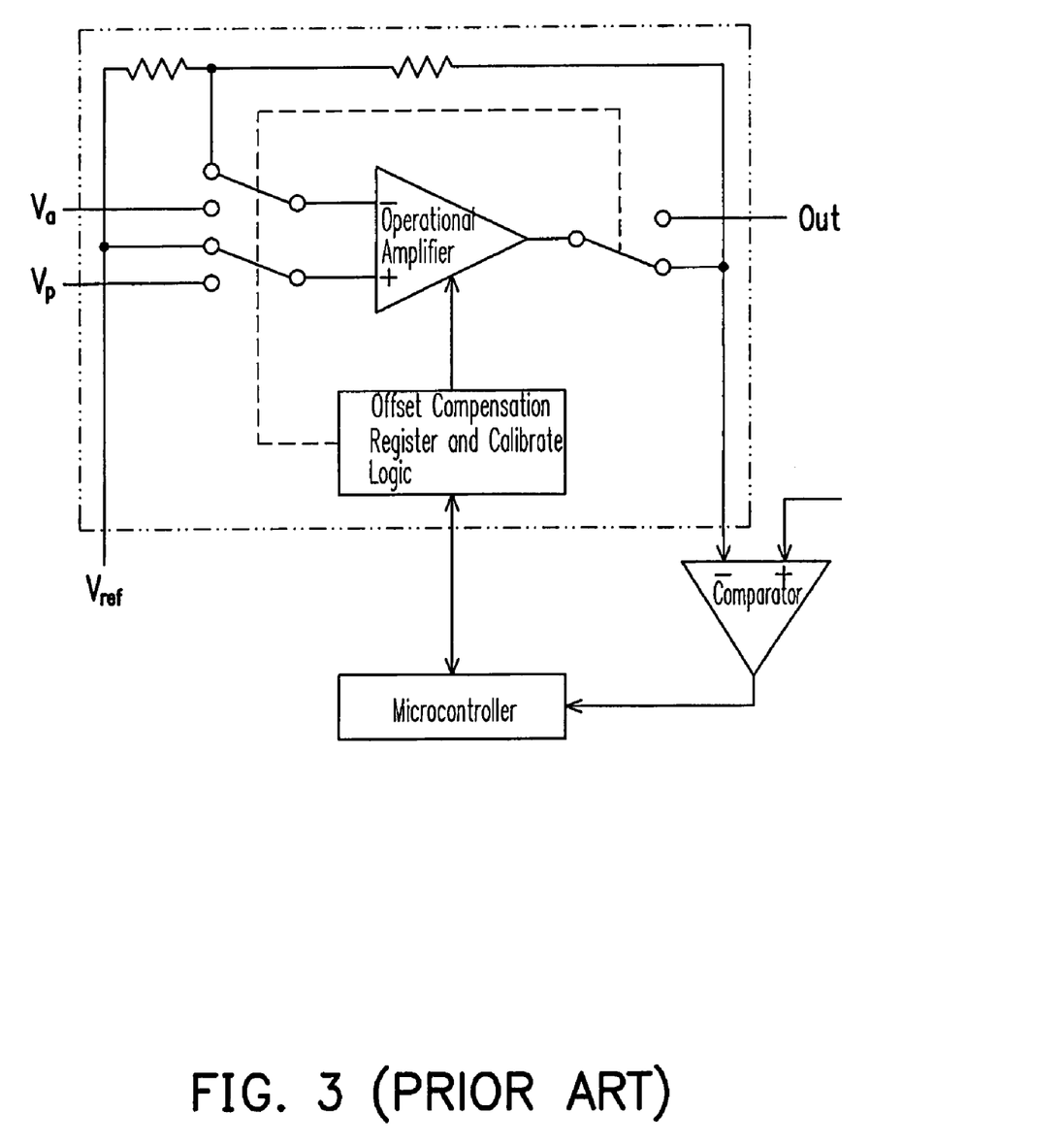
FIG. 3 is a circuit diagram of an input voltage offset calibration of an analog device using a microcontroller.

FIG. 3 is a circuit diagram of an input voltage offset calibration of an analog device using a microcontroller disclosed in US Patent Publication No. U.S. Pat. No. 6,515,464. Referring to FIG. 3, the microcontroller is utilized to send a control code to a calibrate logic and then compensate the offset voltage of an analog device to determine whether an output voltage of an operational amplifier is larger than the voltage of the positive terminal of the comparator. If the output of the comparator transits, the microcontroller calculates the offset voltage of the operational amplifier, and compensates the operational amplifier through the calibrate logic. However, since the comparator has offset voltage, the offset voltage of the operational amplifier cannot be compensated to the minimum by this technique.

Figure 4:
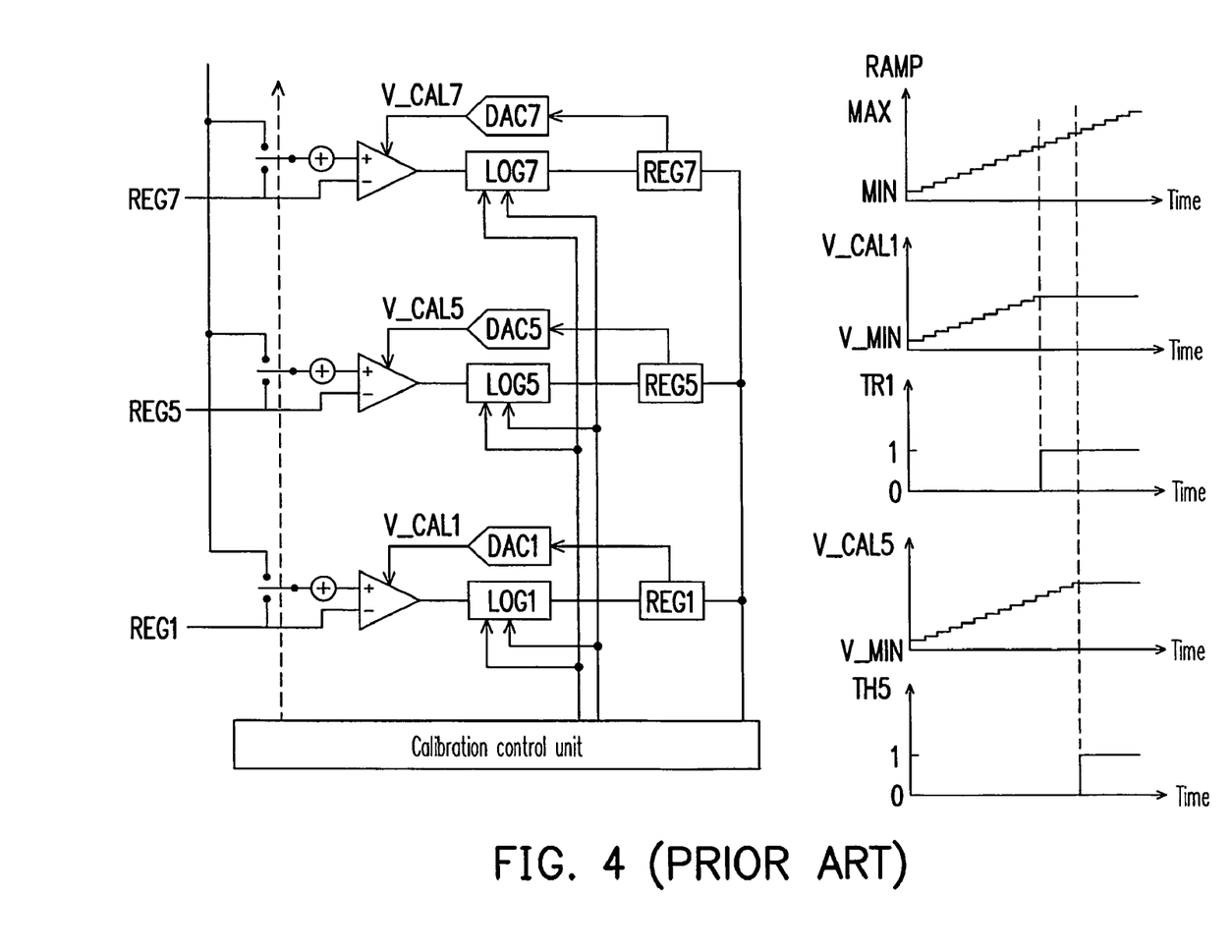
FIG. 4 is a circuit diagram of a comparator offset calibration of conventional A/D converters.

FIG. 4 is a circuit diagram of a comparator offset calibration of A/D converters disclosed in US Patent Publication No. U.S. Pat. No. 7,075,465. Referring to FIG. 4, a ramp output by a counter of a calibration control unit is converted by DAC1~DAC7 to generate calibration voltages V_CAL1~V_CAL7, so as to calibrate the comparators COMP1~COMP7. During the calibration, the two input ends of the comparators COMP1~COMP7 receive reference voltages REF1~REF7, respectively. In the course of the continuous counting of the counter, when the comparators COMP1~COMP7 have transition points, the calibration of the transited comparator and the ramp thereof are stopped. This method can be applied to compensate a high precision comparator.

Figure 5:
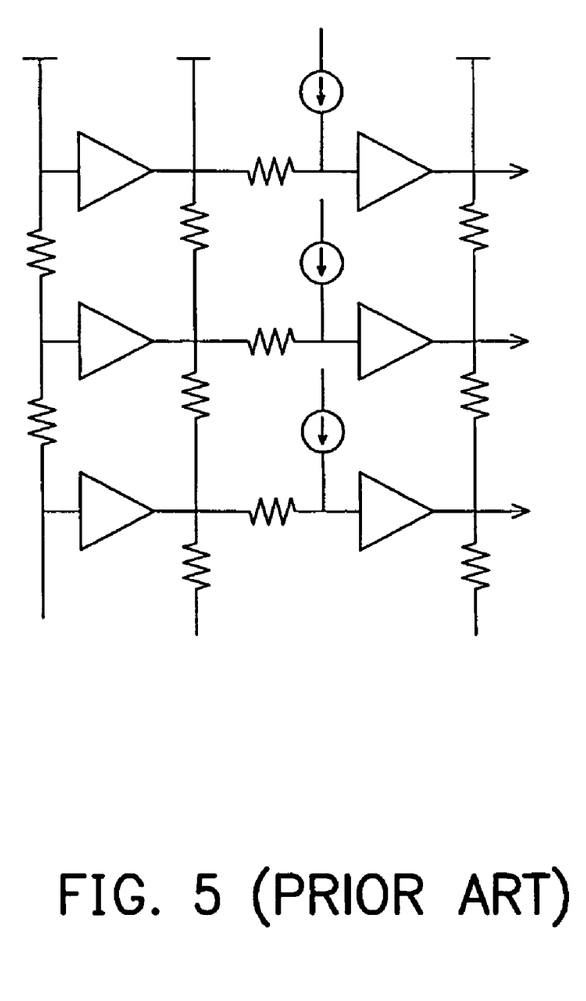
FIG. 5 is a circuit diagram of conventional ADC linearity improvement.

FIG. 5 is a circuit diagram of ADC linearity improvement disclosed in US Patent Publication No. U.S. Pat. No. 6,847,320. A series adjustment resistor is placed between an averaging resistor and a subordinate pre-amplifier. In addition, in calibration, an adjustment current flows through the adjustment resistor to reduce the effect of the offset voltage on the ADC, thereby improving the linearity of the ADC.

SUMMARY OF THE INVENTION

The present invention is directed to an ADC with calibration to effectively solve the offset voltage problem in a circuit and achieve the functional requirements of low power.

The ADC with calibration provided by the present invention includes at least one conversion unit. The conversion unit includes a comparator, a control unit, a count unit, and a calibration unit. The comparator is used to compare the voltage of a first input terminal with the voltage of a second input terminal and output a comparison result. The control unit outputs a control signal according to the comparison result of the comparator. The count unit performs a count operation according to the control signal, and outputs a count result. The calibration unit provides a reference voltage to the second input terminal of the comparator, and adjusts the level of the reference voltage according to the count result of the count unit.

In the present invention, the calibration units are adopted to replace the reference ladder resistor in a conventional circuit, thereby eliminating the influence to the reference ladder resistance, and effectively solving the total offset voltage on the path of the equivalent input offset voltage of the comparator. The digital-to-analog conversion unit and control unit do not consume power after the calibration is completed, thereby meeting the functional requirements of low power.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 6:
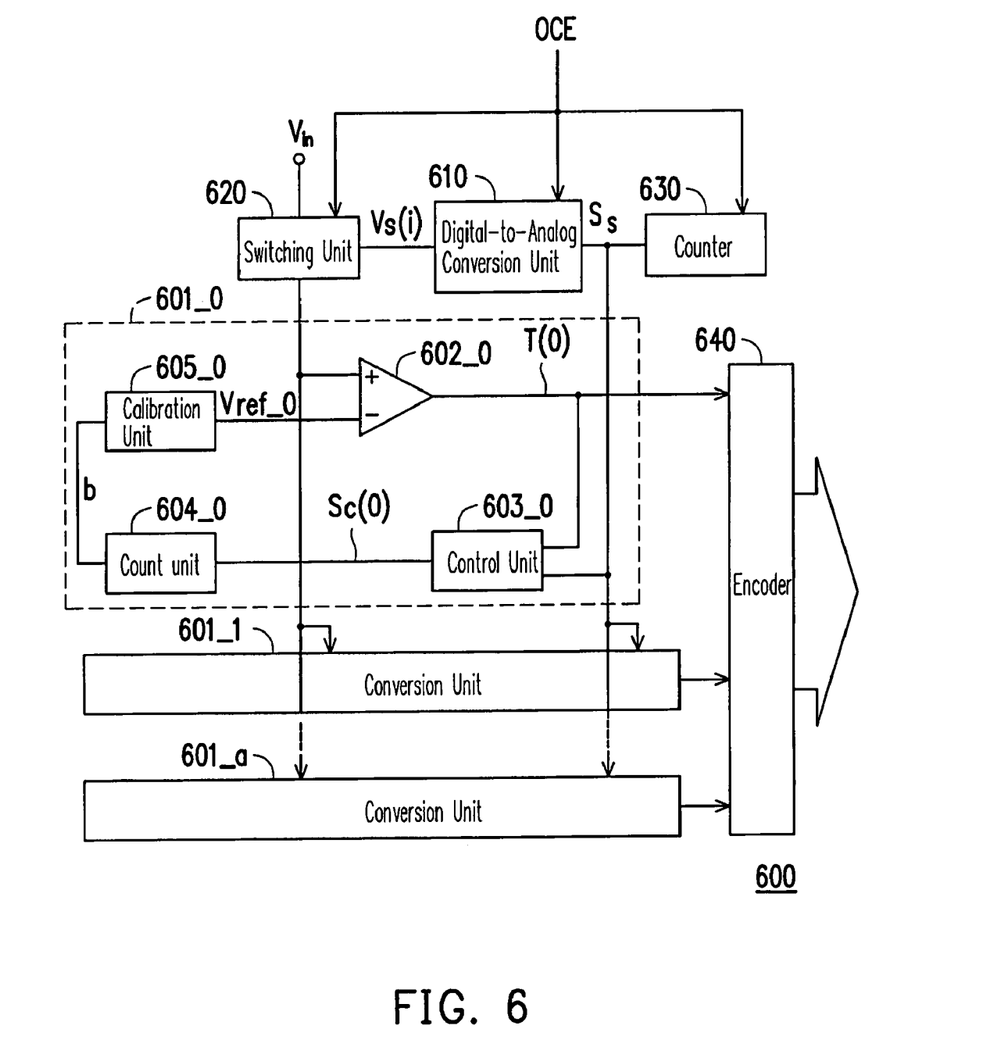
FIG. 6 is a block diagram of an ADC with calibration according to an embodiment of the present invention.

FIG. 6 is a block diagram of an ADC with calibration according to an embodiment of the present invention. The ADC 600 includes a plurality of conversion units 601_0, 601_1, . . . , 601_a, a digital-to-analog conversion (DAC) unit 610, a switching unit 620, a counter 630, and an encoder 640, where "a=0~$2_n$–1", "a" is the number of the conversion units, and "n" is the output bits of the encoder 640. For example, if the ADC 600 is a 4-bit converter, a=$2^4$–1=15, i.e., the ADC 600 includes sixteen conversion units 601_0~601_15. If the ADC 600 is a 6-bit converter, a=$2^6$–1=63, i.e., the ADC 600 includes sixty-four conversion units 601_0~601_63.

The ADC 600 is activated to be in a calibration state by an offset calibration enable (OCE) signal (i.e. the signal OCE). During a normal operation, the DAC unit 610 and the counter 630 would be disenabled by the signal OCE. The switching unit 620 controlled by the signal OCE conducts an analog input signal Vin to the conversion units 601_0~601_a. The conversion units 601_0~601_a convert the analog input signal Vin into a digital thermometer code. The encoder 640 converts the thermometer code output by the conversion units 601_0~601_a into another digital code (such as a Gray code and a binary code).

During a calibration, the DAC unit 610 and the counter 630 would be enabled by the signal OCE. The switching unit 620 conducts an analog standard voltage Vs(i) output by the digital-to-analog conversion unit 610 to the conversion units 601_0~601_a where the "i" is an integer, and 0≦i≦$2^n$–1. The counter 630 can be a mod-$2_n$ up/down counter, i.e., the counter 630 can count up or down in a range of 0~$2^n$–1. In this embodiment, the count result of the counter 630 is used as a selecting signal Ss. The counter 630 provides the selecting signal Ss to the conversion units 601_0~601_a, so as to determine which conversion unit can be calibrated. Meanwhile, the digital-to-analog conversion unit 610 converts the selecting signal Ss into a corresponding standard voltage Vs(i). The standard voltage Vs(i) is transmitted to the conversion unit 601_0~601_a via the switching unit 620. Under the control of the selecting signal Ss, the conversion unit 601_0~601_a can be calibrated by using the standard voltage Vs(i).

The implementation method of the conversion unit 601_0 will be described as follows, and the conversion units 601_1~601_a can be implemented with reference to the conversion unit 601_0. The conversion unit 601_0 includes a comparator 602_0, a control unit 603_0, a count unit 604_0, and a calibration unit 605_0. The comparator 602_0 compares the voltage of a first input terminal (e.g. a positive input end) and the voltage of a second input terminal (e.g. a negative input end), and outputs a comparison result T(0) to the encoder 640. For example, when T(0)=1, it indicates that the voltage of the positive input terminal of the comparator 602_0 is larger than that of the negative input end. When T(0)=0, it indicates that the voltage of the positive input terminal of the comparator 602_0 is smaller than that of the negative input end. When T(0) is in a metastability state, it indicates that the voltage of the positive input terminal of the comparator 602_0 is similar to that of the negative input end.

The control unit 603_0 determines whether to check the comparison result T(0) of the comparator 602_0 according to the selecting signal Ss output by the counter 630. If the selecting signal Ss represents that the conversion unit 601_0 is selected, the control unit 603_0 checks the level of the comparison result T(0) of the comparator 602_0, and outputs a control signal Sc(0) to the count unit 604_0 accordingly.

In this embodiment, the count unit 604_0 is, for example, a mod-B up/down counter. The mod-B is a resolution of control compensation, and the value of B can be selected by a user optionally. Herein, each step of the count unit 604_0 is set to compensate ±¼ LSB, ±½ LSB, etc. As such, the offset voltage of the comparator 602_0 is compensated to the minimum errors. The count unit 604_0 performs the count operation according to the control of the control signal Sc(0). That is to say, the count unit 604_0 performs the functions of counting up/down and stop counting under the control of the control signal Sc(0). The count unit 604_0 outputs the count result to the calibration unit 605_0.

The calibration unit 605_0 provides a reference voltage Vref_0 to the second input terminal of the comparator 602_0, and adjusts the level of the reference voltage Vref_0 according to the count result of the count unit 604_0. Meanwhile, the digital-to-analog conversion unit 610 also outputs a corresponding analog standard voltage Vs(0) according to the selecting signal Ss. The analog standard voltage Vs(0) is input to the first input terminal of the comparator 601_0 via the switching unit 620.

Figure 7:
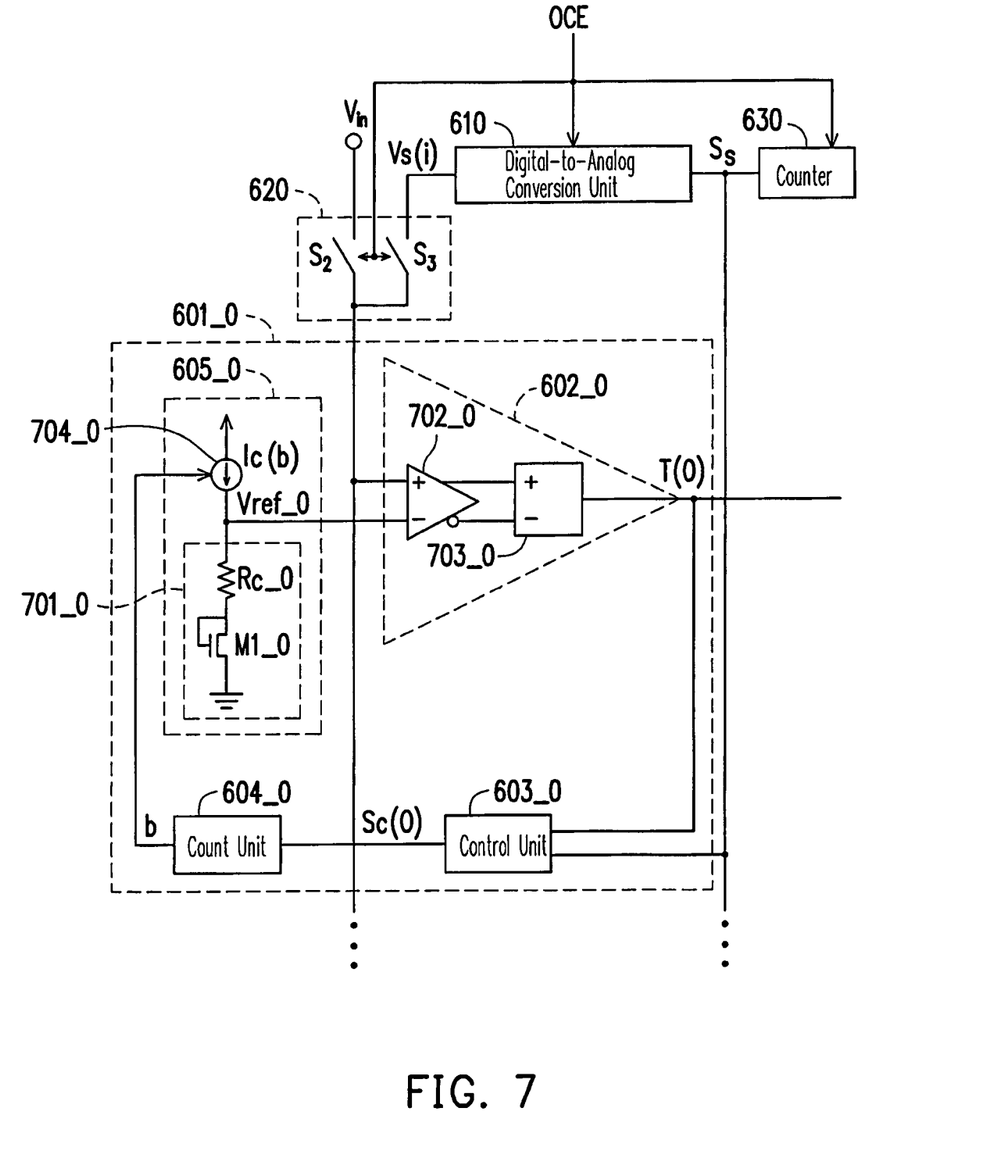
FIG. 7 is a circuit diagram illustrating the ADC with calibration of FIG. 6 according to an embodiment of the present invention.

FIG. 7 is a circuit diagram illustrating the ADC with calibration of FIG. 6 according to an embodiment of the present invention. The calibration unit 605_0 includes a controlled current source 704_0 and a current-to-voltage converter 701_0. The controlled current source 704_0 provides a reference current source/sink Ic(b), and adjusts the reference current Ic(b) according to the count result of the count unit 604_0. The current-to-voltage converter 701_0 is coupled to the controlled current source 704_0. The current-to-voltage converter 701_0 further includes a resistor Rc_0 and a transistor M1_0. A first terminal of the resistor Rc_0 is coupled to the controlled current source 704_0. A drain and a gate of the transistor (e.g. an NMOS transistor) M1_0 are coupled to a second terminal of the resistor Rc_0, and a source of the transistor M1_0 is coupled to a first voltage (a well-defined voltage, e.g. a ground voltage). Therefore, the current-to-voltage converter 701_0 can convert the reference current Ic(b) output by the controlled current source 704_0 to a reference voltage Vref_0.

Figure 8:
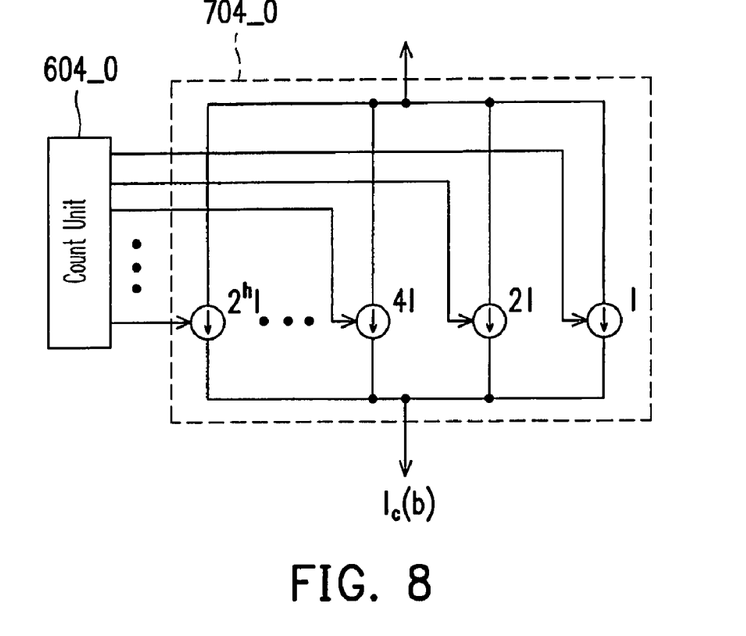
FIG. 8 shows an embodiment of a controlled current source of FIG. 7.

Those of ordinary skill in the art can implement the controlled current source 704_0 by any means. For example, FIG. 8 shows one embodiment of the controlled current source 704_0 according to the present invention. Referring to FIG. 8, the controlled current source 704_0 includes a plurality of sub current sources, and each of the sub current sources provides different currents I, 2I, 4I, . . . , $2^h$I, respectively. Each of the sub current sources determines whether to provide a current respectively according to the count result of the count unit 604_0. For example, when the count value of the count unit 604_0 is 1, the controlled current source 704_0 provides the current I as the reference current Ic(b). When the count value of the count unit 604_a is 2, the controlled current source 704_0 provides the current 2I as the reference current Ic(b). Therefore, each time the count unit 604_a counts up, the reference current Ic(b) is increased by one step of the current I (the magnitude of I can be determined by the user). Therefore, the reference current Ic(b) output by the controlled current source 704_0 can be adjusted according to the count result of the count unit 604_0, thereby determining the level of the reference voltage Vref_0.

Referring to FIG. 7, the comparator 602_0 can include a pre-amplifier 702_0 and a latch 703_0. By employing the latch 703_0, an output signal of the pre-amplifier 702_0 is latched, so as to determine whether the output signal of the comparator 602_0 is at a high logic level "1" or a low logic level "0". A first input terminal (e.g. a positive input end) and a second input terminal (e.g. a negative input end) of the pre-amplifier 702_0 are used as the first input terminal and the second input terminal of the comparator 601_0, respectively. An input terminal of the latch 703_0 is coupled to an output terminal of the pre-amplifier 702_0, and an output terminal of the latch 703_0 outputs the comparison result T(0).

The switching unit 620 of FIG. 7 can include a switch S2 and a switch S3. During the normal operation, the switch S2 is turned on and the switch S3 is turned off by the signal OCE, such that the analog input signal Vin is conducted to the first input terminal of the comparator 602_0. During the calibration, the switch S3 is turned on and the switch S2 is turned off by the signal OCE, such that the analog standard voltage Vs(i) output by the digital-to-analog conversion unit 610 is conducted to the first input terminal of the comparator 602_0.

Figure 9:
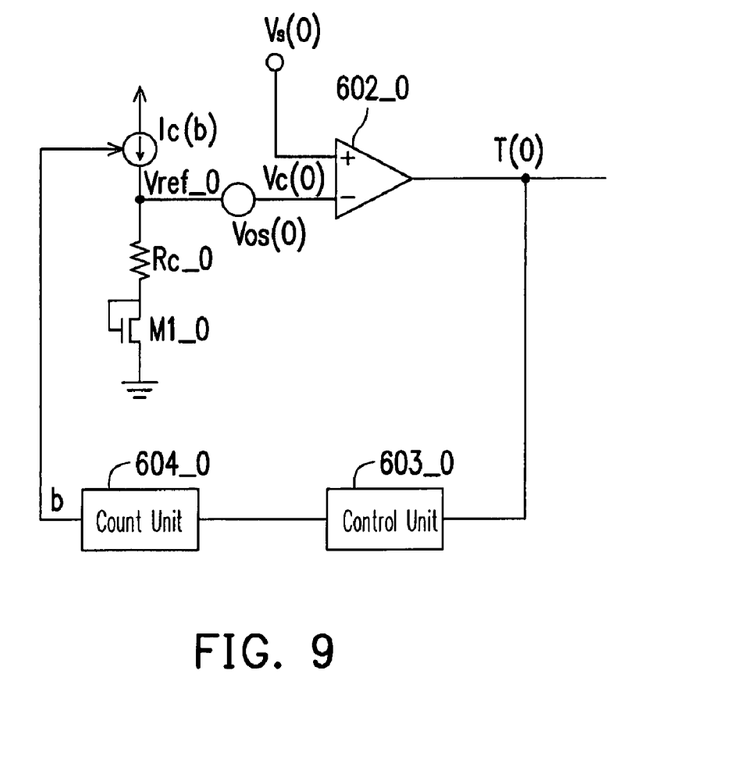
FIG. 9 is a circuit block diagram of a conversion unit.
Figure 10:
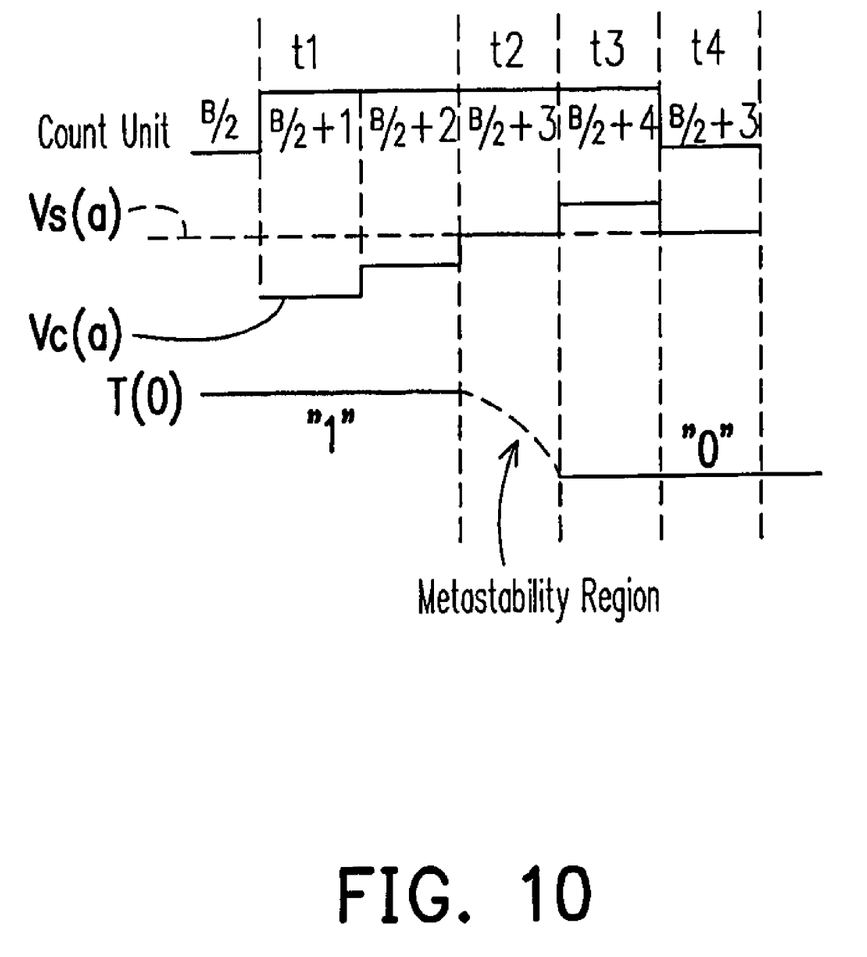
FIG. 10 is a calibration timing diagram of FIG. 9.

Next, the calibration process of the conversion unit 601_0 is described with reference to FIGS. 9 and 10. The calibration processes of the other conversion units 601_1~601_a are similar to that of the conversion unit 601_0, and the description thereof will not be repeated. FIG. 9 is a circuit block diagram of a conversion unit 601_0. FIG. 10 is a calibration timing diagram of FIG. 9. Referring to FIGS. 9 and 10, firstly, the initial value of the count unit 604_0 is set as b=B/2 (i.e., the medium value of the count range of the count unit 604_0). Furthermore, provided that the selecting signal Ss designates the conversion unit 601_0 to perform the calibration process (the standard voltage Vs(i) output by the digital-to-analog conversion unit 610 is equal to Vs(0) at this time). The symbol Vos(0) in FIG. 9 denotes an equivalent offset voltage within the conversion unit 601_0. At this time, the output functions of the comparator 602_0 are formulas (1)~(3). The reference voltage Vref_0=Ic(b)*Rc_0+$V_{DSI}$, and the symbol $V_{DSI}$ stands for the drain-source voltage of the transistor M1_0.

$$T(0)=1;\ \text{if}\ Vs(0) > Vref\_0 \pm V_{OS}(0) \quad \text{formula (1)}$$

$$T(0)=0;\ \text{if}\ Vs(0) < Vref\_0 \pm V_{OS}(0) \quad \text{formula (2)}$$

$$T(0)=\text{metastability};\ \text{if}\ Vs(0) \approx Vref\_0 \pm V_{OS}(0) \quad \text{formula (3)}$$

For example, as for the time t1 in FIG. 10, provided that the output function T(0) of the comparator 602_0 is the formula (1), it indicates that Vs(0)>Vref_0±$V_{OS}$(0) at this time. Therefore, the control unit 603_0 controls the count unit 604_0 to increase by one step each time from the initial value b=B/2, such that the reference current Ic(b) is increased gradually (i.e., the reference voltage Vref_0 is increased by one step each time), and the voltage Vc(0) of the second input terminal of the comparator 602_0 (i.e., Vref_0±$V_{OS}$(0)) approaches Vs(0) gradually.

For example, as for the time t2 in FIG. 10, when the equivalent offset voltage $V_{OS}$(0) is compensated to the minimum, the output T(0) of the comparator enters a metastability region (at this time, the output function T(0) of the comparator 602_0 is the formula (3)). However, the count unit 604_0 still increases until the output T(0) of the comparator 602_0 transits, and at that time, the control unit 603_0 controls the count unit 604_0 to stop counting immediately. Herein, the output function T(0) of the comparator 602_0 is the formula (2). However, since the compensation on the equivalent offset voltage Vos(a) is the minimum, the comparator must be in the metastability region. Therefore, the control unit 603_0 can control the count unit 604_0 to subtract 1 from the count value (for example, change b from the original B/2+4 to B/2+3, e.g. the time t4 in FIG. 10). Then, the count unit 604_0 keeps outputting b after 1 is subtracted (B/2+3 in FIG. 10).

Since the offset voltage of the comparator 602_0 can be divided into a static offset and a dynamic offset, during the calibration process, the static offset can be minimized effectively. In a course of processing the dynamic offset, the high-speed and high-resolution digital-to-analog conversion unit 610 can be used to solve the problem of dynamic offset. The calibration unit 605_0 not only replaces of the conventional reference ladder tap, but also has the capability of calibrating offset voltage.

Figure 11:
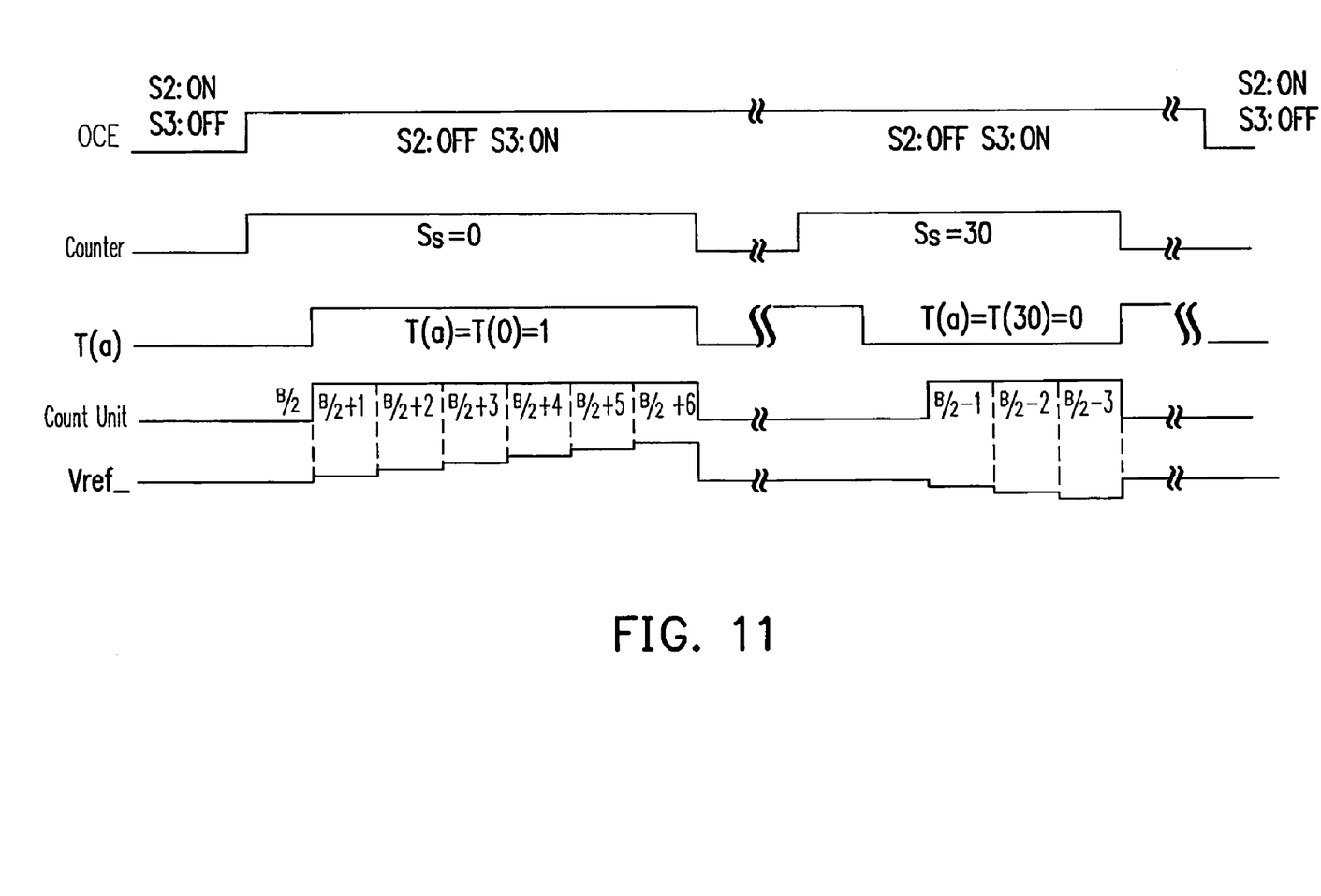
FIG. 11 is a calibration timing diagram of FIG. 7.

FIG. 11 is a calibration timing diagram of FIG. 7. Referring to FIGS. 6, 7, and 11 together, it is assumed that the ADC 600 is a 6-bit converter (i.e., $2^6$=64 conversion units 601_0~601_63). In addition, it is assumed that count units 604_0~604_63 are mod-16 up/down counters, b=B/2=8 in an initial state.

The ADC 600 is activated to be in a calibration state by an offset calibration enable (OCE) signal. At this point, according to the signal OCE, the switch S2 is turned off, and the switch S3 is turned on. Under the control of the counter 630, the conversion units 601_0~601_63 determine the calibration timing according to the selecting signal Ss. If the selecting signal Ss of the counter 630 is 0, only the conversion unit 601_0 among the conversion units 601_0~601_63 performs the calibration process. At the same time, the digital-to-analog conversion unit 610 generates a corresponding standard voltage Vs(0) according to the selecting signal Ss of the counter 630, and transmits the standard voltage Vs(0) to the comparator 602_0 via the switch S3.

Provided that Vs(0)>Vref_0±$V_{OS}$(0), i.e., the output result T(0) of the comparator is 1, the control unit 603_0 sends out the control signal Sc(0) to the count unit 604_0, such that the count unit 604_0 performs a count up operation. Therefore, the count unit 604_0 sends out the count values b=B/2+1=9, B/2+2=10, B/2+3=11, and so on in sequence. The controlled current source 704_0 is controlled by the count unit 604_0 to increase the reference current Ic(b) flowing through Rc_0 (i.e., the reference voltage Vref_0 is increased). Therefore, the reference voltage Vref_0 approaches Vs(0) slowly until Vs(0)<Vref_0 (e.g., when the count value b is B/2+6=14). At this time, the output of the comparator 602_0 transits (i.e., T(0)=0), and the control unit 603_0 outputs the control signal Sc(0) to make the count unit 604_0 return to the previous state, i.e., B/2+5=13. Then, the control unit 603_0 controls the count unit 604_0 to stop counting, and stores the count value b into a register of the control unit 603_0 (or stores the count value b in the register into the count unit 604_0), thereby completing the calibration operation of the comparator 602_0.

If the selecting signal Ss of the counter 630 is 30, only the conversion unit 601_30 among the conversion units 601_0~601_63 performs the calibration process. At the same time, the digital-to-analog conversion unit 610 generates a corresponding standard voltage Vs(30) according to the selecting signal Ss of the counter 630, and transmits the standard voltage Vs(30) to the comparator 602_30 via the switch S3. At this time, provided that Vs(30)<Vref_30±Vos(30), the comparator 602_30 outputs T(30)=0. At this time, the control unit 603_30 sends out the control signal Sc(30) to the count unit 604_30 and performs a count down operation. Under the control of the control unit 603_30, the count unit 604_30 sends out the count values b=B/2−1=7, B/2−2=6, B/2−3=5 and so on in sequence. The controlled current source 704_30 is controlled by the count unit 604_0 to decrease the reference current Ic(b) flowing through Rc_30 (i.e., the reference voltage Vref_30 is decreased). Therefore, the reference voltage Vref_30 approaches Vs(30) slowly until till Vs(30)>Vref_30±$V_{OS}$(30) (e.g., when the count value b is B/2−3=5).

At this time, the output of the comparator 602_30 transits (i.e., T(30)=1), and the control unit 603_30 outputs the control signal Sc(30) to make the count unit 604_30 return to the previous state, i.e., B/2−2=6. Then, the control unit 603_30 controls the count unit 604_30 to stop counting, and stores the count value b into the register of the control unit 603_30 (or stores the count value b into the register of the count unit 604_30). Thereby, the calibration process of the comparator 602_30 is completed.

When the conversion units 601_0~601_63 complete the calibration processes, the ADC 600 stops calibration. At this time, the ADC 600 is reset to be in a normal operation state (i.e., the switch S2 is turned on, and the switch S3 is turned off). In this embodiment, in the normal operation state, the digital-to-analog conversion unit 610, the counter 630, and the control logic are disabled, so as to save power consumption.

Figure 12:
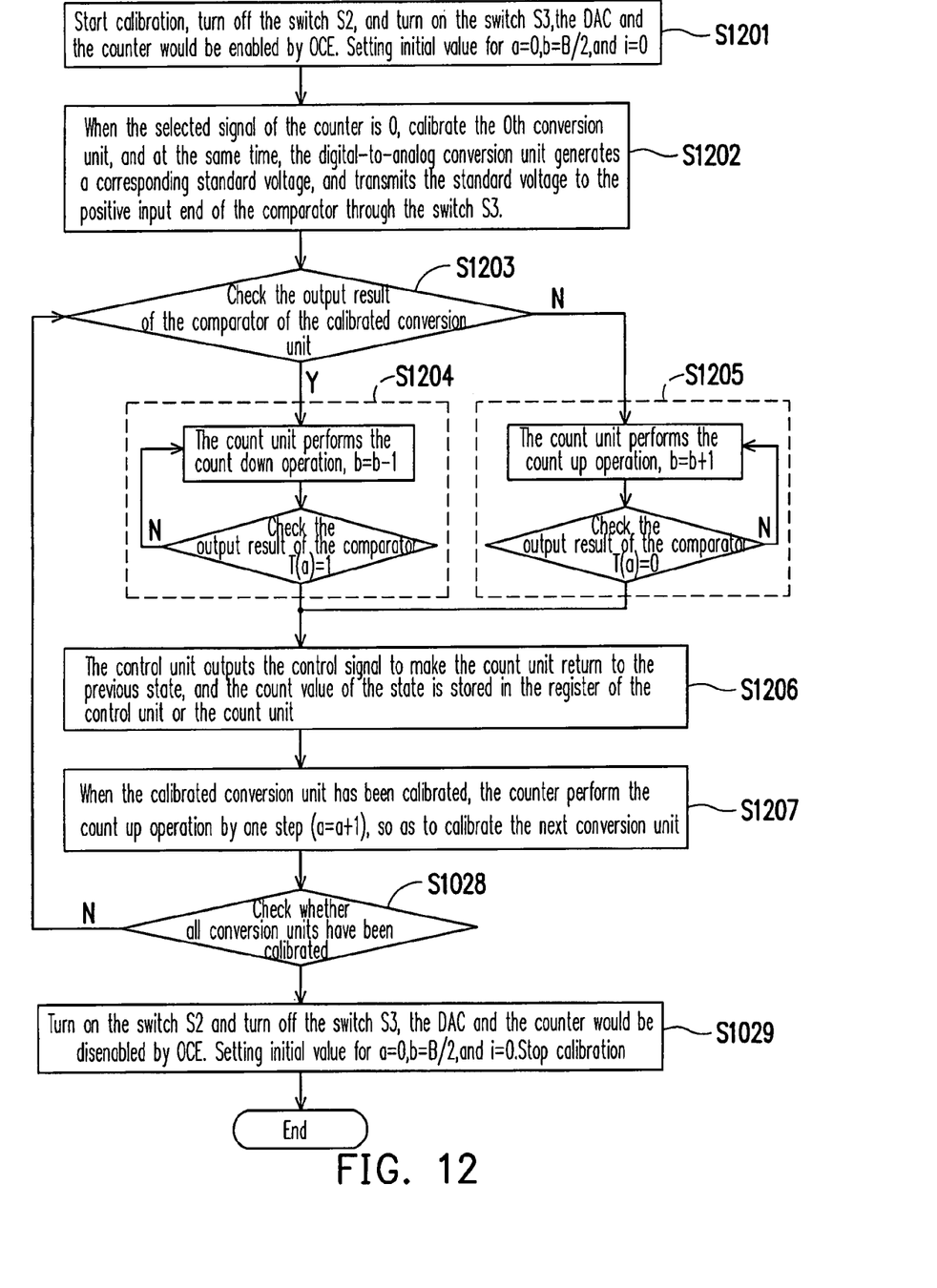
FIG. 12 is a calibration flow chart of the ADC with calibration according to an embodiment of the present invention.

FIG. 12 is a calibration flow chart of the ADC with calibration according to an embodiment of the present invention. Referring to FIGS. 6, 7, and 12 together, in Step S1201, the ADC 600 is activated by the offset calibration enable signal OCE to start calibration. At this time, according to the signal OCE, the switch S2 is turned off, the switch S3 is turned on, and the digital-to-analog conversion (DAC) unit 610 and the counter 630 would be enabled. Setting initial value for a=0, b=B/2, and i=0. In Step S1202, the selecting signal Ss of the counter 630 is 0 and the conversion unit 601_0 first performs the calibration process. At this time, the digital-to-analog conversion unit 610 generates a corresponding standard voltage Vs(0) according to the selecting signal Ss of the counter 630, and transmits the standard voltage Vs(0) to the comparator 602_0 via the switch S3.

In Step S1203, the output result T(0) of the comparator 602_0 is checked (i.e., determine the voltages of the first input terminal and the second input terminal of the comparator 602_0). When T(0)=0 (i.e., the voltage of the positive input terminal of the comparator 602_0 is smaller than that of the negative input terminal), proceed to Step S1204. When T(0)=1 (i.e., the voltage of the positive input terminal of the comparator 602_0 is larger than that of the negative input terminal), proceed to Step S1025.

In Step S1024, i.e., the output T(0) of the comparator 602_0 is 0, and at this time, the control unit 603_0 sends out the control signal Sc(0) to the count unit 604_0, such that the count unit 604_0 performs the count down operation. The controlled current source 704_0 is controlled by the count unit 604_0 to decrease the reference current Ic(b) flowing through Rc_0 (i.e., the reference voltage Vref_0 is decreased). Therefore, the reference voltage Vref_0 slowly approaches Vs(0) until the output of the comparator 602_0 transits (i.e., T(0)=1), and then proceed to Step S1206.

In Step S1205, i.e., the output result T(0) of the comparator 602_0 is 1. At this time, the control unit 603_0 sends out the control signal Sc(0) to the count unit 604_0, such that count unit 604_0 performs the count up operation. The controlled current source 704_0 is controlled by the count unit 604_0 to increase the reference current Ic(b) flowing through Rc_0 (i.e., the reference voltage Vref_0 is increased). Therefore, the reference voltage Vref_0 approaches Vs(0) slowly until the output of the comparator 602_0 transits (i.e., T(0)=0). Then, proceed to Step S1206.

In Step S1206, the control unit 603_0 outputs the control signal Sc(0) to make the count unit 604_0 return to the previous state. Next, the control unit 603_0 controls the count unit 604_0 to stop counting, and stores the count value b−1 in the previous state into the register of the control unit 603_0 (or stores the count value b into the register of the count unit 604_30), i.e., the calibration of the conversion unit 601_0 is completed. In Step S1207, the calibration of the conversion unit 601_0 is completed. At this time, the counter 630 performs the count up operation by one step, i.e., a=a+1, so as to calibrate the next conversion unit. In Step S1208, it is checked whether all conversion units have been calibrated. If a≠$2^n$−1, the process returns to Step S1203 to continue the calibration of the conversion units. If a=$2^n$−1, it indicates that the last conversion unit 601__$2^n$−1 has been calibrated (i.e., all conversion units have been calibrated). Next, the process proceeds to Step S1209, and at this time, setting initial value for a=0, b=B/2, and i=0. In Step S1209, according to the signal OCE, the switch S2 is turned on, the switch S3 is turned off, and the DAC unit 610 and the counter 630 would be disenabled, such that the ADC 600 enters the normal operation state again.

The counter 630 in the flow chart calibrates the conversion units of the ADC 600 by means of counting up. However, the counter 630 is not limited to perform calibration by means of counting up, and the count down may also be adopted and the details will not be repeated.

To sum up, in the present invention, the calibration unit is used to replace the reference ladder resistor in the conventional circuit, thereby eliminate the influence of the reference ladder resistor, and effectively solving the problem of the total offset voltage on the path of the equivalent input offset voltage of the comparator. The digital-to-analog conversion unit and the control unit do not consume power after completing the calibration, thereby meeting the functional requirements of low power. Furthermore, the ADC in the present invention is also suitable for the comparator-based ADC, such as a two-type architecture and a folding and interpolation architecture.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog-to-digital converter (ADC) with calibration, comprising at least one conversion unit, wherein the conversion unit comprises:

a comparator, for comparing an voltage of a first input terminal with an voltage of a second input terminal and outputting a comparison result;

a control unit, for outputting a control signal according to the comparison result of the comparator;

a count unit, for performing a count operation according to the control signal and outputting a count result; and a calibration unit, for providing a reference voltage to the second input terminal of the comparator and adjusting a level of the reference voltage according to the count result of the count unit.

2. The ADC with calibration as claimed in claim 1, wherein the control unit further determines whether to check the comparison result of the comparator according to a selecting signal.

3. The ADC with calibration as claimed in claim 2, further comprising:

a digital-to-analog conversion unit, for converting the selecting signal into a corresponding standard voltage; and a switching unit, for conducting an analog input signal to the first input terminal of the comparator during a normal operation and conducting the corresponding standard voltage output by the digital-to-analog conversion unit to the first input terminal of the comparator during a calibration.

4. The ADC with calibration as claimed in claim 2, further comprising a counter for providing the selecting signal, and it could be a up/down counter.

5. The ADC with calibration as claimed in claim 1, wherein the calibration unit comprises:

a controlled current source, for providing a reference current source/sink and adjusting the reference current according to the count result of the count unit; and a current-to-voltage converter, coupled to the controlled current source, for converting the reference current source/sink into the reference voltage.

6. The ADC with calibration as claimed in claim 5, wherein the controlled current source comprises a plurality of sub current sources, and each of the sub current sources determines whether to provide a current according to the count result of the count unit, respectively.

7. The ADC with calibration as claimed in claim 5, wherein the current-to-voltage converter comprises:

a resistor, comprising a first terminal coupled to the controlled current source; and a transistor, comprising a drain and a gate coupled to a second terminal of the resistor, and a source coupled to a first voltage.

8. The ADC with calibration as claimed in claim 7, wherein the first voltage is a well-defined voltage.

9. The ADC with calibration as claimed in claim 1, wherein the comparator comprises:

a pre-amplifier, comprising a first input terminal and a second input terminal serving as the first input terminal and the second input terminal of the comparator, respectively; and a latch, comprising an input terminal coupled to an output terminal of the pre-amplifier to output the comparison result.

* * * * *